United States Patent
Peng et al.

(10) Patent No.: US 8,797,820 B2
(45) Date of Patent: Aug. 5, 2014

(54) SOFT BREAKDOWN MODE, LOW VOLTAGE, LOW POWER ANTIFUSE-BASED NON-VOLATILE MEMORY CELL

(75) Inventors: Jack Z. Peng, San Jose, CA (US); David Fong, San Jose, CA (US)

(73) Assignee: Chengdu Kiloway Electronics Inc., Chengdu, Sichuan (CN)

( * ) Notice: Subject to any disclaimer, the term of this patent is extended or adjusted under 35 U.S.C. 154(b) by 64 days.

(21) Appl. No.: 13/563,665

(22) Filed: Jul. 31, 2012

(65) Prior Publication Data

US 2013/0208525 A1     Aug. 15, 2013

Related U.S. Application Data

(63) Continuation-in-part of application No. 12/796,031, filed on Jun. 8, 2010, now Pat. No. 8,259,518.

(51) Int. Cl.
*G11C 17/18* (2006.01)
*G11C 17/16* (2006.01)

(52) U.S. Cl.
CPC .............. *G11C 17/165* (2013.01); *G11C 17/18* (2013.01); *G11C 17/16* (2013.01)
USPC ......................................... 365/225.7; 365/96

(58) Field of Classification Search
USPC ................................................. 365/225.7, 96
See application file for complete search history.

(56) References Cited

U.S. PATENT DOCUMENTS

| | | | | |
|---|---|---|---|---|
| 6,775,197 B2 * | 8/2004 | Novosel et al. | ............ | 365/225.7 |
| 6,901,004 B2 * | 5/2005 | Smith et al. | ................... | 365/154 |
| 7,102,951 B2 * | 9/2006 | Paillet et al. | ............... | 365/225.7 |
| 7,280,425 B2 * | 10/2007 | Keshavarzi et al. | ........ | 365/225.7 |
| 7,508,694 B2 * | 3/2009 | Terzioglu et al. | ............... | 365/96 |
| 8,259,518 B2 * | 9/2012 | Peng et al. | ................. | 365/189.2 |

* cited by examiner

*Primary Examiner* — Pho M Luu
(74) *Attorney, Agent, or Firm* — James Cai; Schein & Cai LLP

(57) ABSTRACT

A non-volatile memory cell using two transistors, a bit select and a sense device and an antifuse device. The antifuse device is implemented with a field-effect transistor operated to behave like an antifuse when the cell is selected and a modest programming voltage under 5.5 volts and a current under 5-µA is applied. Only a soft breakdown is needed in the thin gate oxide because a local sense transistor is used during read operations to detect the programming and amplify it for column sense amplifiers. Reading also only requires low voltages of about one volt.

4 Claims, 11 Drawing Sheets

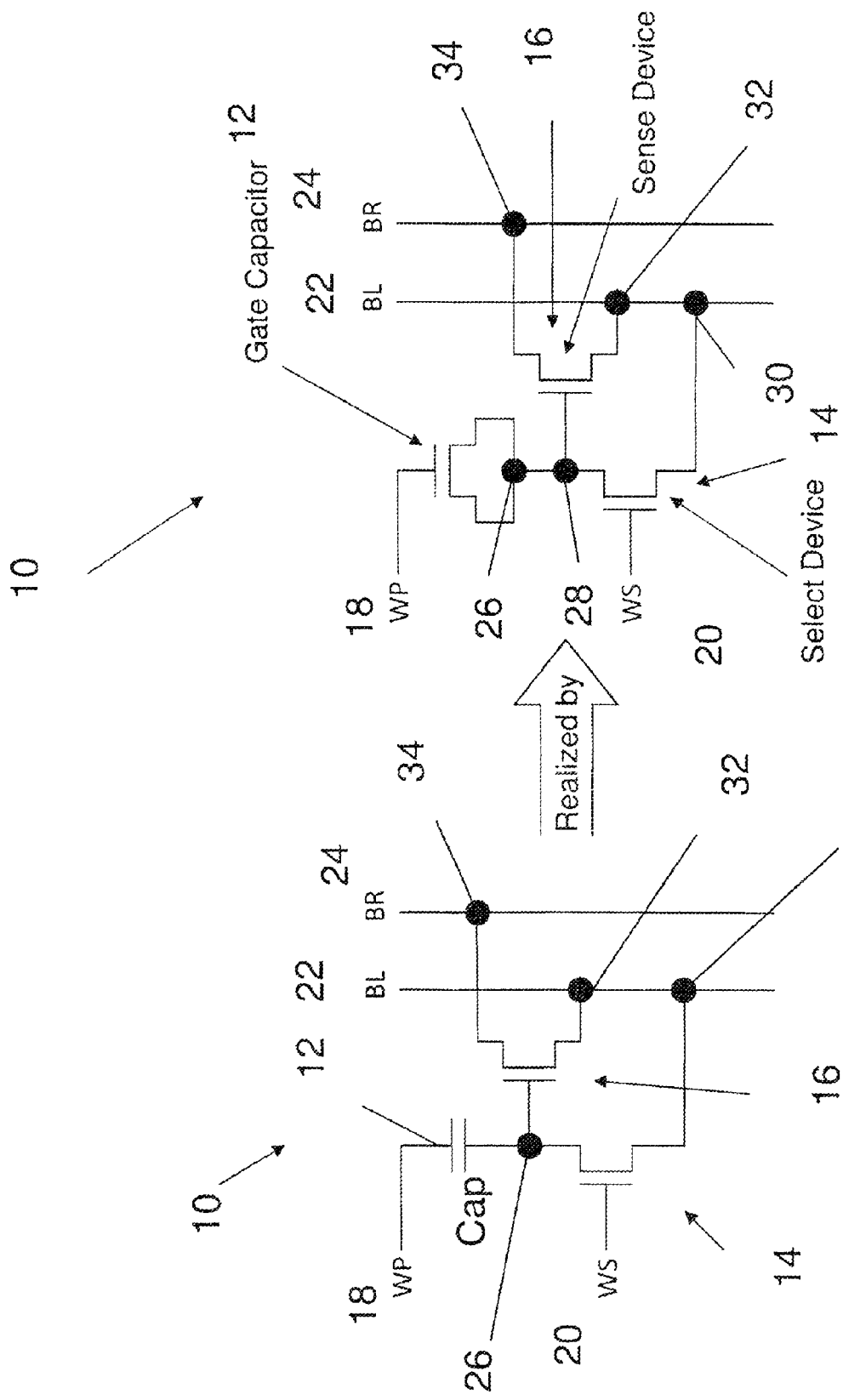

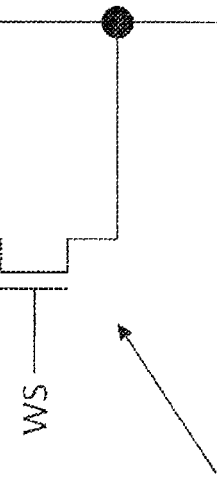
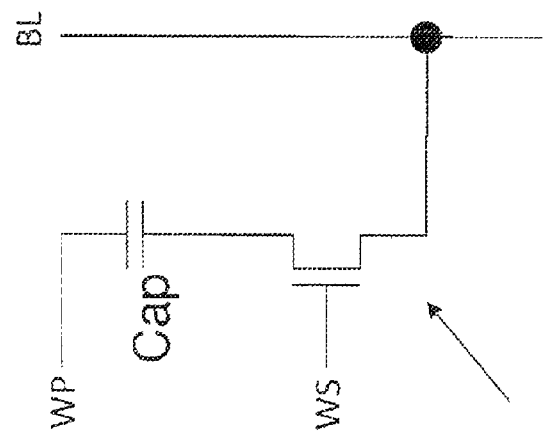
FIG. 1C PRIOR ART

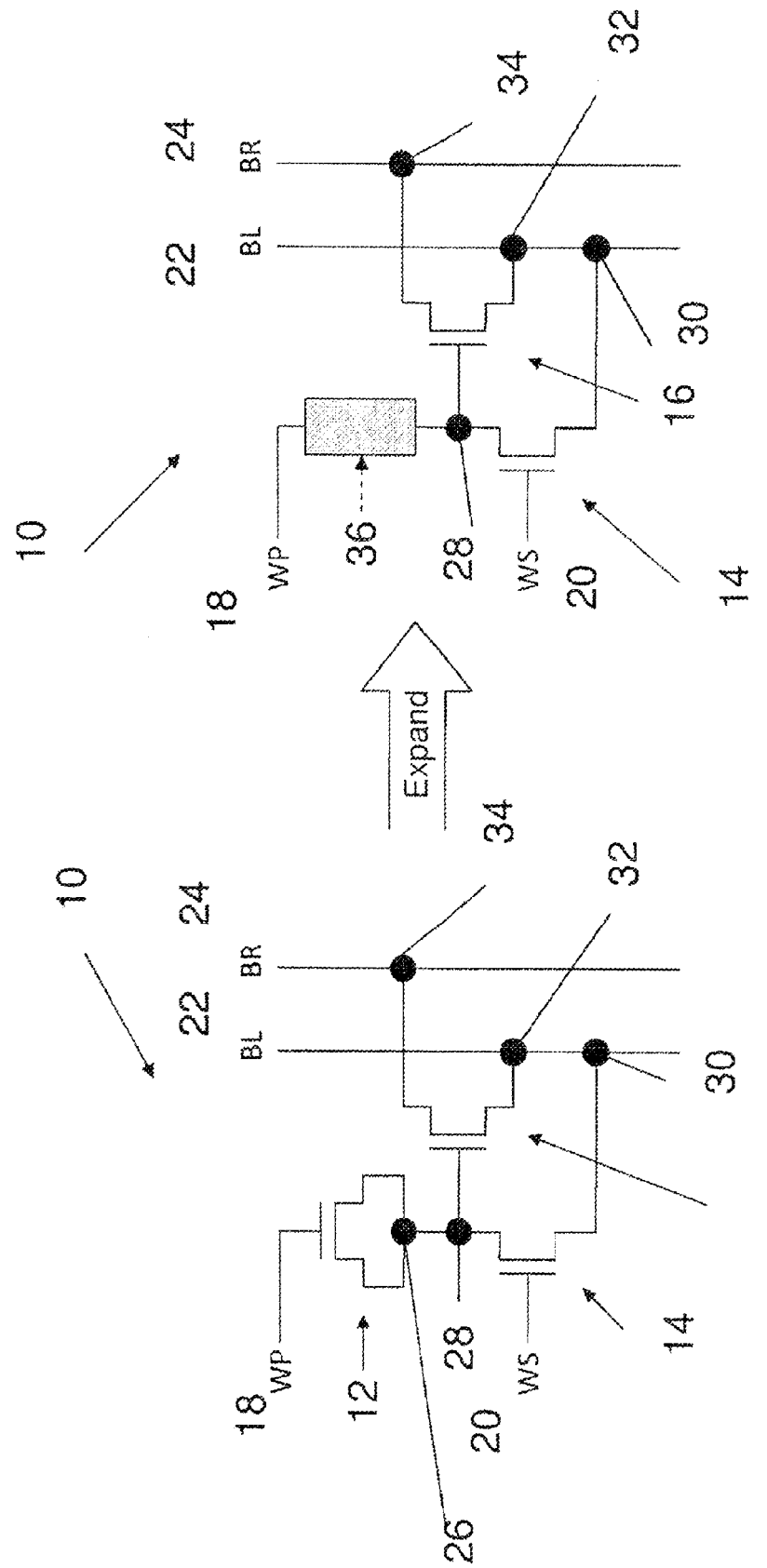

| | Cell | V(WP) | V(WS) | V(BL) | V(BR) |
|---|---|---|---|---|---|
| Programming | A SW/SB | 5.5V | 2.5V | 0V | 0V |
| | B SW/UB | 5.5V | 2.5V | 2.5V | 2.5V |
| | C UW/SB | 2.5V | 0V | 0V | 0V |
| | D UW/UB | 2.5V | 0V | 2.5V | 2.5V |
| Read | A SW/SB | 1.0V | 0V | 0V | V Sensing(+) |
| | B SW/UB | 1.0V | 0V | 0V | 0V |
| | C UW/SB | 0V | 0V | 0V | V Sensing(+) |
| | D UW/UB | 0V | 0V | 0V | 0V |
| | | | | | Sensing Line |

FIG. 5

| | Cell | V(WP) | V(WS) | V(BL) | V(BR) |
|---|---|---|---|---|---|
| Programming | A SW/SB | 5.5V | 2.5V | 0V | Floating |
| | B SW/UB | 5.5V | 2.5V | 2.5V | Floating |
| | C UW/SB | 2.5V | 0V | 0V | Floating |
| | D UW/UB | 2.5V | 0V | 2.5V | Floating |
| Read | A SW/SB | 1.0V | 0V | 0V | V Sensing(+) |
| | B SW/UB | 1.0V | 0V | Floating | Floating |
| | C UW/SB | 0V | 0V | 0V | V Sensing(+) |
| | D UW/UB | 0V | 0V | Floating | Floating |
| | | | | | Sensing Line |

FIG. 6

All voltages are the negative values of those in I.F.3.c. for all N devices.

| | Cell | V(WP) | V(WS) | V(BL) | V(BR) |
|---|---|---|---|---|---|
| Programming | SW/SB | -5.5V | -2.5V | 0V | Floating |
| | SW/UB | -5.5V | -2.5V | -2.5V | Floating |
| | UW/SB | -2.5V | 0V | 0V | Floating |
| | UW/UB | -2.5V | 0V | -2.5V | Floating |
| Read | SW/SB | -1.0V | 0V | 0V | V Sensing(-) |
| | SW/UB | -1.0V | 0V | Floating | Floating |
| | UW/SB | 0V | 0V | 0V | V Sensing(-) |
| | UW/UB | 0V | 0V | Floating | Floating |
| | | | | | Sensing Line |

US 8,797,820 B2

SOFT BREAKDOWN MODE, LOW VOLTAGE, LOW POWER ANTIFUSE-BASED NON-VOLATILE MEMORY CELL

This application is a continuation in part (CIP) of U.S. patent application Ser. No. 12/796,031, filed Jun. 8, 2010, now matured into U.S. Pat. No. 8,259,518, and titled, A NEW LOW VOLTAGE AND LOW POWER XPM CELL, by the present inventors, Jack Zezhong Peng and David Fong.

RELATED APPLICATIONS

This application is a continuation in part (CIP) of U.S. patent application Ser. No. 12/796,031, filed Jun. 8, 2010, and titled, A NEW LOW VOLTAGE AND LOW POWER XPM CELL, by the present inventors, Jack Zezhong Peng and David Fong. Such Parent application received a Notice of Allowance that was mailed May 30, 2012.

FIELD OF THE INVENTION

The present invention is directed to non-volatile memory (NVM), and more particularly to one-time programmable (OTP) non-volatile memory cells based on gate oxide breakdown phenomena, and especially soft breakdown modes for low power programming and low voltage reading operations.

BACKGROUND OF THE RELATED ART

Nonvolatile memories retain the data stored in them even when the power has been removed. Such are particularly needed in digital cameras, smartphones, radio frequency identification (RFID) tags, and other applications. One commonly available type of nonvolatile memory is the programmable read-only memory ("PROM"), which uses wordline-bitline crosspoints. These may include fuses, antifuses, and trapped charge devices (for example, floating gate avalanche injection metal oxide semiconductor ("FAMOS") transistor) to store logical information. The term "crosspoint" refers to the intersection of a bitline and a word line.

An example of one type of PROM cell that uses the breakdown of a silicon dioxide layer in a capacitor to store digital data is disclosed in U.S. Pat. No. 6,215,140, to Reisinger, et al., which is herein incorporated by reference in its entirety. The basic PROM disclosed by Reisinger, et al., uses a series combination of an oxide capacitor and a junction diode as the crosspoint. An intact capacitor represents the logic value 0, and an electrically broken-down capacitor represents the logic value 1. The thickness of the silicon dioxide layer is adjusted to obtain the desired operation specifications. Such cells are described in U.S. Pat. Nos. 6,667,902; 6,700,151; 6,798,693; and 6,650,143 all to Jack Z. Peng. All of which are incorporated by reference herein in their entireties. Improvements in the various processes used for fabricating the different types of nonvolatile memory tend to lag improvements in widely used processes such as the advanced CMOS logic process as disclosed in United States Published Patent Application 2010/0091545 to Jack Z. Peng, et al., which is incorporated herein by reference in its entirety.

XPM™ is a proprietary antifuse-based, embedded non-volatile memory (NVM) marketed by Kilopass Technology, Inc., (Santa Clara, Calif.) as an electrical programmable fuse (eFUSE) replacement. XPM is a field programmable memory that can provide higher security, larger capacity, smaller footprints, and lower active and standby power demands. XPM™ is a foundry agnostic, and its associated IP can be well protected and transferred between silicon foundries.

Prior art NVM cells, e.g., as described in U.S. Pat. Nos. 6,667,902; 6,700,151; 6,798,693; and 6,650,143 all issued to Jack Z. Peng, can require too much power for programming and for reading in particular applications. For example, conventional cells can require a programmed gate oxide (in a gate capacitor) to be pushed into its hard breakdown regions so a low enough resistance will result for a reasonable cell read sense current (1-10 µA). Conventional cells can also require a very high read voltage (Vwp), >2.5-3.3V. A large enough voltage drop is needed over the high resistance of breakdown gate oxide, e.g., 1-10 µA×500K ohms=0.5-5V. A resistance of 3M ohms will cause a drop of 3-10V. Some high resistance cells may not be read out with high enough signal levels. These examples indicate several disadvantages with the prior art memory technologies.

There is a need for NVM cells with improved performance and that overcome the shortcomings of the prior art.

SUMMARY OF THE INVENTION

A non-volatile memory (NVM) cell comprises an antifuse device implemented with a field-effect transistor operated to behave like an antifuse when the cell is selected and a modest programming voltage under 5.5 volts and under 5-µA is applied. Only a soft breakdown is needed in the thin gate oxide because a local sense transistor is used during read operations to detect the programming and amplify it for column sense amplifiers.

BRIEF DESCRIPTION OF THE FIGURES

The foregoing and other objects, features and advantages of the present invention will be apparent from the following more particular description of preferred embodiments of the present invention, as illustrated in the accompanying drawings in which like reference characters refer to the same parts throughout different views. The drawings are not meant to limit the present invention to particular mechanisms for carrying out the present invention in practice, but rather, are illustrative of certain ways of performing the present invention. Others will be readily apparent to those skilled in the art.

FIGS. 1A-1B are schematic diagrams of an XPM memory cell embodiment of the present invention;

FIG. 1C is a schematic diagram of a prior art memory cell;

FIGS. 2A-2B are schematic diagrams of another memory cell embodiment;

FIGS. 5-6 diagram various voltage tables for the memory cells and array of FIG. 4;

DETAILED DESCRIPTION OF THE PREFERRED EMBODIMENTS

Figure 3A:
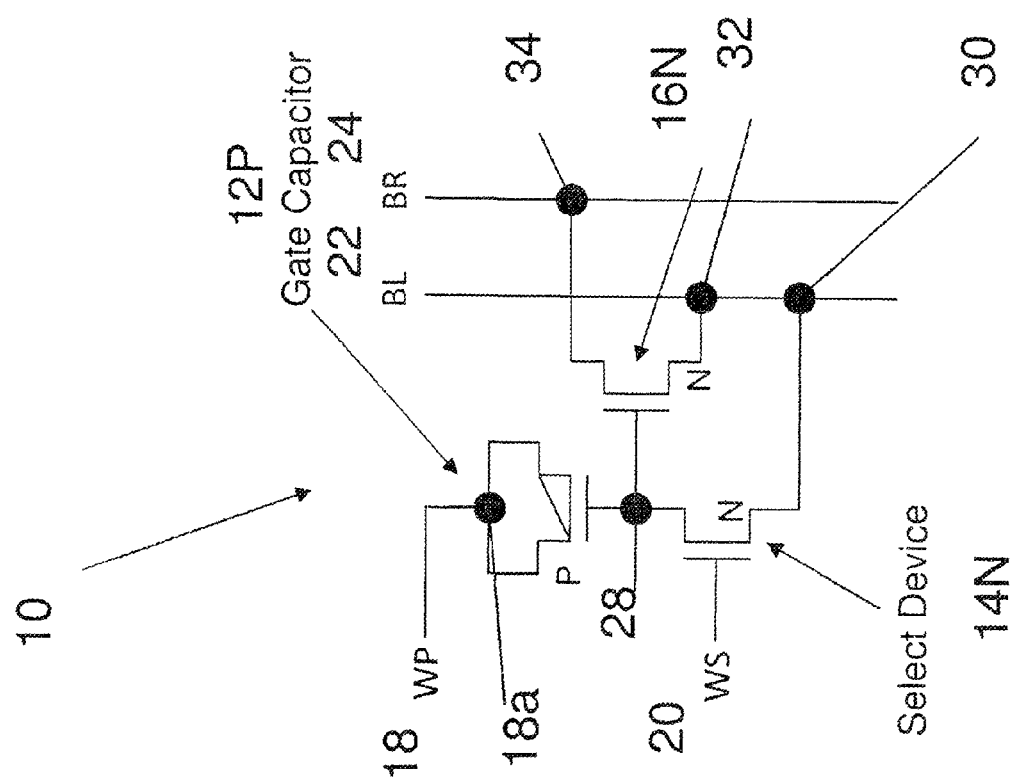
FIGS. 3A-3B are schematic diagrams of memory cell embodiments in P and N, and P implementations respectively.

The embodiments comprise one-time programmable (OTP) nonvolatile memory cells. The memory cells occupy small areas and are optimized for low bit count applications. Such memory cells can be used for code storage memories, serial configuration memories, and as individual fuse bits for identification (ID), trimming, and other post-fabrication system-on-chip (SoC) customization.

In general, programming this type of memory cell involves steering a high voltage pulse to a special fuse transistor in a particular memory cell or core. The current in the pulse is used to push the special fuse transistor into permanent breakdown, e.g., blowing like fuse. Reading back the programming involves passing a current through the fuse memory cell, and sensing the current level. The current that passes through the fuse is an indication of the cell's data content, a "1" or a "0," depending on the agreed convention.

An XPM memory cell, like that marketed by Kilopass Technologies, Inc. (Santa Clara, Calif.), is represented in FIG. 1C, such is also described in United States Published Patent Application 2010/0091545. A fuse memory cell in FIG. 1C includes a "select" transistor M1 and a programming transistor M0, both of which can be fabricated using standard CMOS processes without additional masking. Here, transistor M1 acts as a switch and M0 acts as a current limiter. The current passing through M0 on a read cycle is an indication of its programmed logic level, or data content.

The gate of programming transistor M0 simulates one plate of a capacitor and the application of a voltage to it causes an inversion layer to form in the dielectric under the gate structure. The other plate and second terminal of the capacitor is simulated by the source/drain region.

The select transistor M1 needs to have a thicker gate oxide than that of programming transistor M0 so it does not also breakdown during programming. See, United States Published Patent Application 2010/0091545. When programming, WP is elevated to a predetermined high voltage (Vpp), WS is turned ON, and BL is grounded. About 50 μs will be needed to break down the gate oxide of programming transistor M0. A broken down gate oxide or not sets one of two possible leakage current levels in the memory cell and, therefore, its perceived programmed logic level. When reading the content of the memory cell, an appropriate voltage is applied to the gates of transistors M0 and M1, connecting M0 to bit-line BL. The current passing through M1 and BL is limited by M0, and the programming state is interpreted by a sense amplifier (not shown).

FIGS. 1A and 1B, represent an antifuse-based, embedded non-volatile memory (NVM) cell of the present invention. Such is referred to herein as XPM cell 10, and includes a gate capacitor 12, and transistor devices 14 and 16. Gate capacitor 12 functions like an antifuse, unprogrammed it is the equivalent of a small value capacitor. Programmed, it is the equivalent of a high value resistor. Here, the gate oxide of a field effect transistor can be used as gate capacitor 12. Such will normally be open, but if a breakdown voltage is applied long enough, the gate oxide will first do a soft breakdown and then if the current is applied long enough and strong enough a hard breakdown will occur. Other antifuse equivalents could also be used. The important thing in embodiments of the present invention is that soft breakdowns are good enough to support proper functioning when used in circuits like those illustrated for memory cell 10. Power and operating voltages can be minimized.

XPM cell 10 receives memory array control signals on lines WS 18, WP and BL 22, and BR 24. BL 22 and BR 24 are a bit lines, WS and WP 18 are word lines. The memory cells lie at the intersections of the word lines and bit lines. Alternatively, field-effect transistor or other device is configured to serve as gate capacitor 12 with a second node 28, as in FIG. 1B.

A field-effect transistor (FET) 14 is used as a bit-selection device connected to node 28. FET 14 is controlled by word line WS and bit line BL 22. A second FET 16 is used as a program sensing device. FET 16 is connected between bit line BL 22 at node 32, and bit line BR 24 at node 34. FET 16 is controlled by gate capacitor 12 and bit-selection FET 14. The gate capacitor 12 is connected to word line 18 and is connected to node 26 and FET's 14 and 16. FET's 14 and 16 may be implemented with depleted p-channel FET (DEPFET), metal oxide semiconductor FET (MOSFET), double gate MOSFET (DG-MOSFET), fast reverse or fast recovery epitaxial diode FET (FREDFET), high electron mobility transistor (HEMT), or other similar technologies.

FIGS. 1A and 1B represent an unprogrammed cell, e.g., no sense current passing through either FET capacitor 12, FET 14 or FET 16. As such, memory cell 10 is in the so-called "0" state. When FET capacitor 12 has antifused during programming into soft breakdown, it will thereafter pass a current when FET 14 is selected that can be sensed by FET 16. In such case, memory cell 10 is in the so-called "1" state. It cannot be reversed to "0" state after programming.

Figure 7:
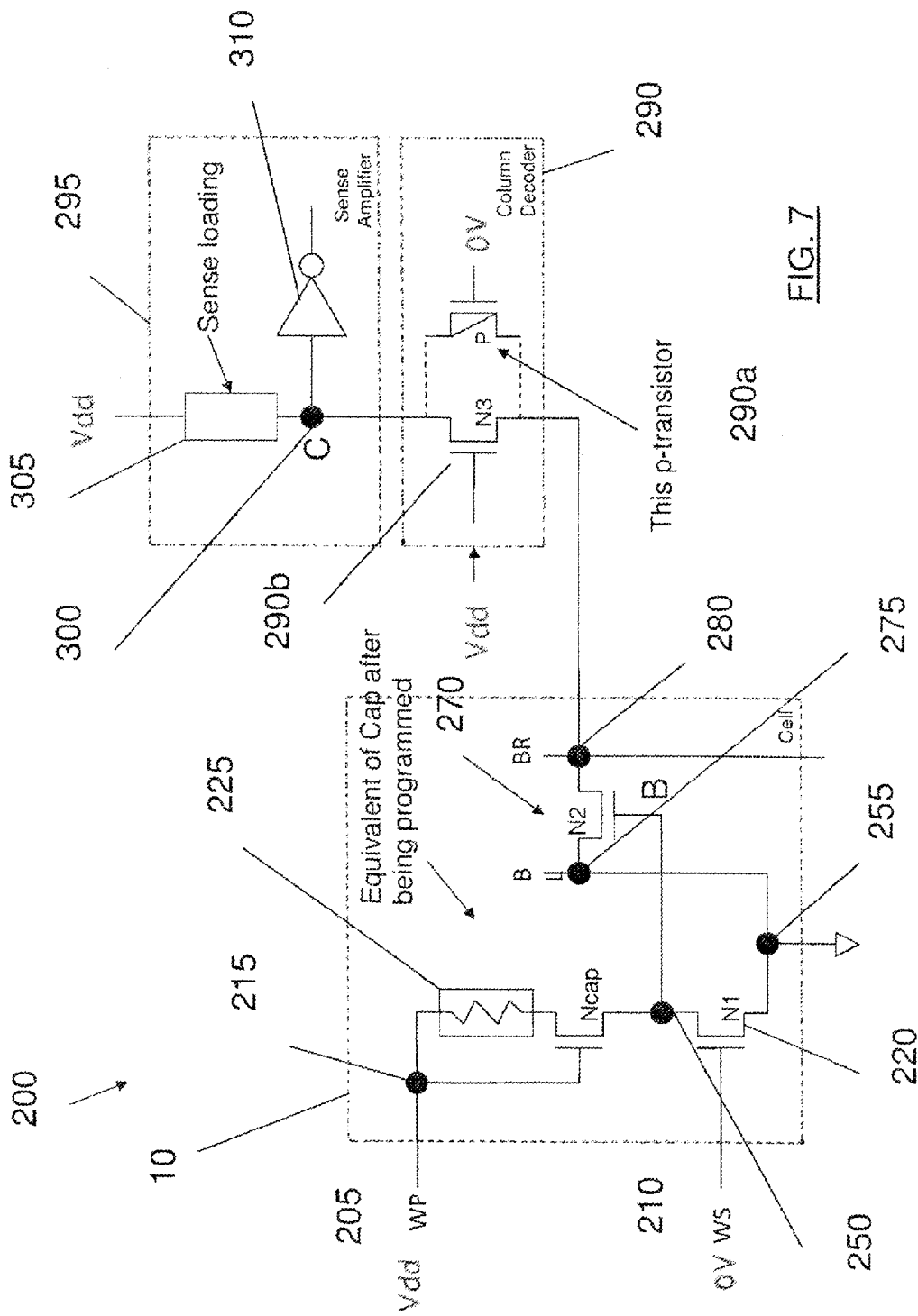
FIG. 7 represents a memory cell connected to a column decoder and a sense amplifier in a sensing scheme of the present invention.

FIG. 7 represents such memory cell in an equivalent circuit 200 after being programmed. A current will pass through node 255 and NCap device 225 to raise the voltage at point B node 275, and the gate of FET 270. This circuit does not require the gate oxide to be in hard breakdown for programming. The current needed for programming can therefore be greatly reduced, e.g., from a few hundred μA conventionally, down to a few μA. After FET capacitor 12 has been programmed by soft or hard breakdown, the equivalent circuit 200 in FIG. 7 represents how the sense current passes through.

Programming circuit 200 to cause a breakdown of the gate oxide only requires a current of 1-5 μA. This is in contrast with conventional designs which can require 50-150 μA to program each bit. In case of sensing the memory cell, the current passing through gate capacitor 12 is only about 1–nA. In other words, bit-selection FET 14 has a source to drain resistance much larger than 100M ohms during an off state wherein Vws=zero volts. The programmed, breakdown gate oxide has resistance of less than 10M, so resistor voltage divider formed by capacitor and off state bit-selection FET 14 will turn on sensing FET 16.

Programming memory cell 10 of FIGS. 1A and 1B, WP requires elevating to a predetermined high voltage (Vpp), WS is turned ON, and the BL is grounded, for a specified duration of time (e.g., 50 μs), to break down the gate oxide of the FET capacitor 12. This arrangement sets the leakage current level of the memory cell and, therefore, its logic level. When reading the content of the memory cell 10, appropriate voltage is applied to the gates of FET's 12 and 14, which connects FET capacitor 12 to bit-line BL. Thereafter, to classify the logic level of the memory cell 10, the current passing through FET capacitor 12 and BL, which is limited by FET capacitor 12, is sensed by a sense amplifier (not shown).

FIGS. 1A and 1B, only 1 nA traverses through the programmed gate oxide 12 to turn on the controlled sensing device gate 16. In the case of very high resistance of 1M ohms, its voltage drop is only about 1 nA*1M ohms=1 mV. So the voltage Vwp applied to line WP 18 requires only about 0.5V to turn on the sensing device gate 16. Also, the sensing FET 16 is a regular low voltage device, and can operate at a voltage Vds=0.5V to provide 1-10 μA. So, the circuit can have read voltage Vwp as low as 0.5-1 V. In this manner, the present invention can be operable for use with very low voltage as compared to the circuit of FIG. 1C and can be used with low power applications, such as RFID memory, which is advantageous.

FIGS. 2A and 2B represent an alternative embodiment of memory cell 10 where something other is used for FET 12. In FIG. 2B, a capacitor 36 is implemented with ROM, EPROM, EEPROM, Flash memory, PCRAM, FCRAM, MRAM, an antifuse, etc. Capacitor 36 is connected between node 28 and word line WP 18. FET 14 is connected to bit line BL 22 at node 30. Node 28 controls sensing FET 16 which is connected between node 32 and bit line BL 22, and node 34 and bit line BR 24.

Capacitor 36 may require an extra control voltage however, this arrangement is optional and the 36 alternatively may not require any auxiliary voltage. Various configurations are possible and within the scope of the present invention.

Figure 3B:
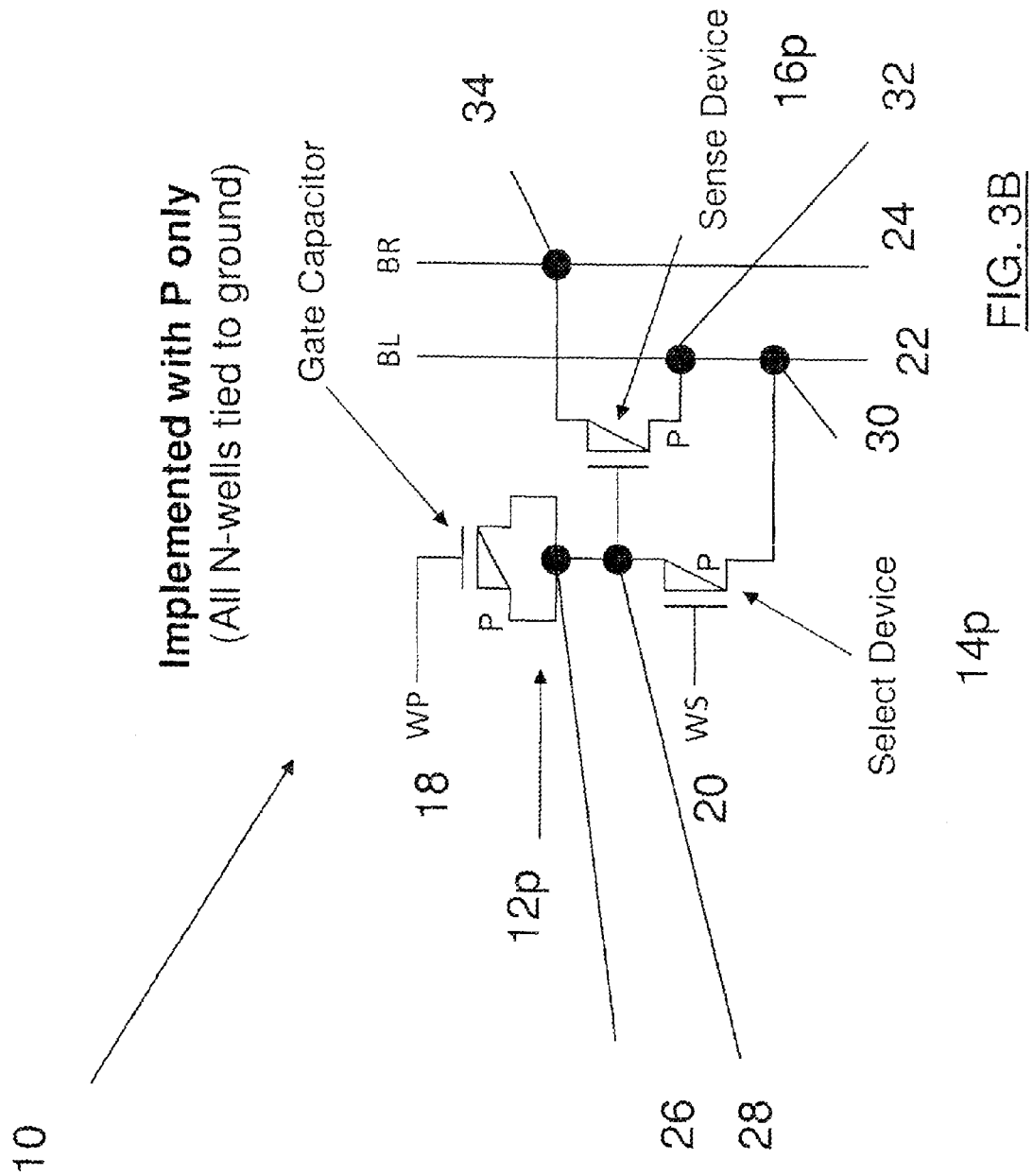

FIG. 3A represents P-type and N-type configurations of memory cell 10. FIG. 3B represents a P-type only configuration with the N-wells of the FET's connected to ground. FIG. 3A represents a configuration of memory cell wherein word line WP 18 is connected to a gate capacitor 12P by a node 18a. Element 12P is FET capacitor 12P. As shown, the gate capacitor 12P is of the P-type configuration and is inverted relative to FIG. 1A and FIG. 1B. The gate capacitor 12P is connected to node 28. Node 28 is connected to the bit-selection FET 14N, which is an N-type device.

A bit-selection FET 14N, and is connected to word line WS and to bit line BL 22 at node 30. A second FET 16N is a sensing device connected to the node 28 and the node 32. Node 32 is connected to bit line BL 22. Second sensing FET 16N is further connected to node 34. Node 34 is connected to bit line BR 24. Sensing FET 16N. In the configuration of FIG. 3A, the gate capacitor 12P is of the P-type while the first and the second devices 14N and 16N are of the N-type. FIG. 3B represents the circuit being implemented with the P-type FET's 12P, 14P, and 16P only and the N wells of the FET's being tied to ground.

In FIG. 3B, as can be understood, gate capacitor 12P is inverted relative to FIG. 3A and is shown connected to word line WP 18. The gate capacitor 12P is also connected to node 26. Node 26 is connected to node 28. Node 28 is connected to the bit-selection FET 14P which is of the P-type. The bit-selection FET 14P is connected to word line WS and is connected to the node 30, which is connected to bit line BL 22. The second FET 16P is the sensing device and is of the P-type. The second FET 16P is connected to node 28 and gate capacitor 12P and first FET 14P. The second FET 16P is also connected to bit line BR 24 by node 34 and bit line BL 22 by node 32. The second FET 16P is also FET. The programming voltages and read voltages are in a table format in FIG. 9. The programming voltages range from −5.5 volts to −2.5 volts while the read voltages are in the range of −1.zero volts. Preferably, the arrangement of FIG. 3B is more preferred than the arrangement of FIG. 3A.

Figure 4:
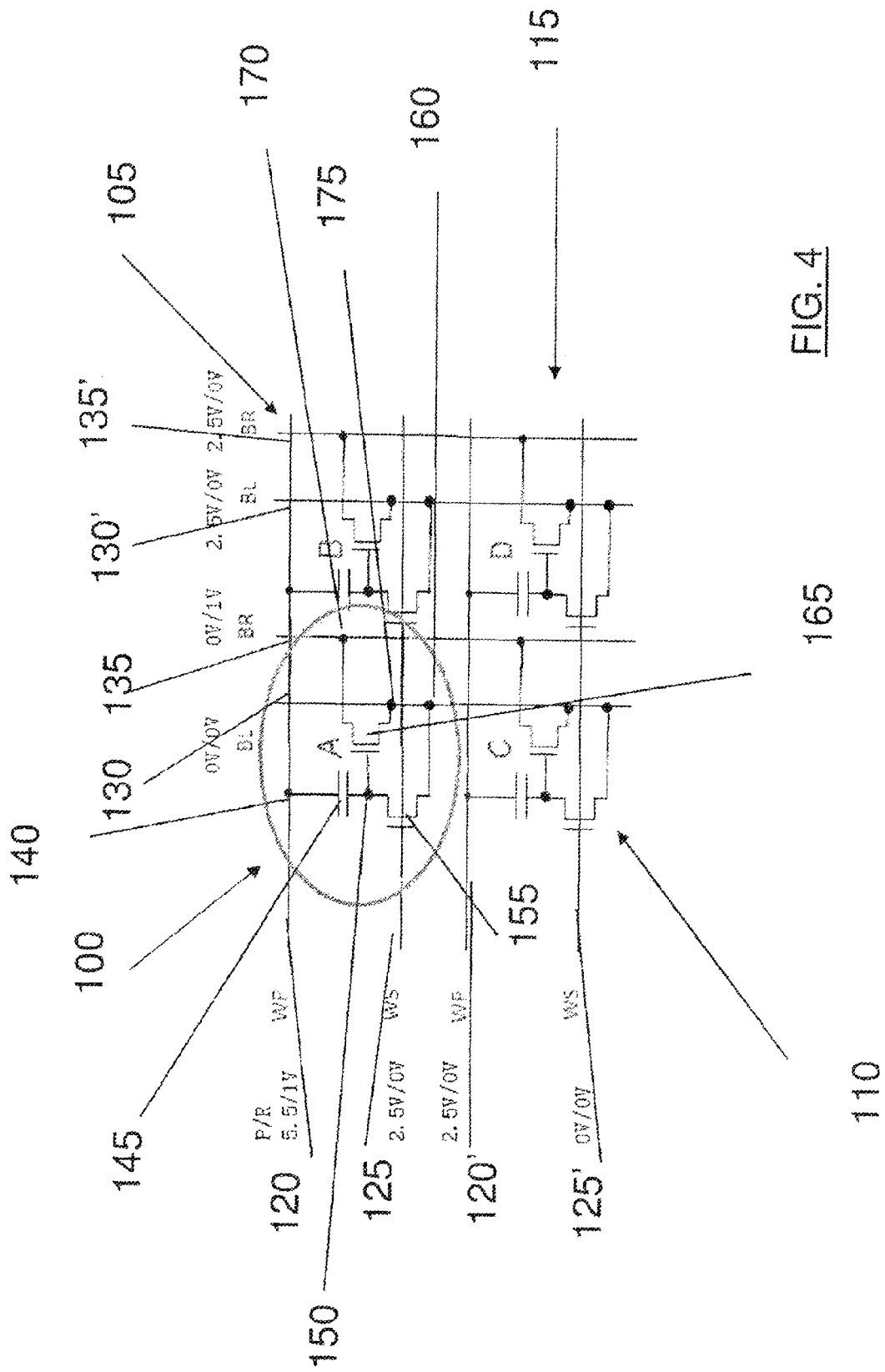
FIG. 4 represents memory cells in a cell array embodiment.

FIG. 4 represents a cell architecture for a 0.13 μm CMOS process, with a first cell 100, a second cell 105, a third cell 110 and a fourth cell 115. The first cell 100 is connected to a first word line 120 (5.5 volts/one volt) and a second word line WS 125 (2.5 volts/zero volts). The first cell 100 also is connected to two bit lines, a bit line BL 130 (zero volts/zero volts) and a bit line BR 135 (zero volts/one volt). The cell also includes third and fourth bit lines 130' and 135' and third and fourth word lines 120' and 125'. Each of the cells 100-115 include a similar configuration with a node 140 connected to a gate capacitor 145 (implemented with a FET). The node 140 is connected to word line WP 120. The gate capacitor 145 is also connected to node 150. Node 150 is connected to a FET 155, which is controlled by word line WS 125.

FET 155 is a bit-selection device 155 and is connected to node 160 and to bit line BL 130. A second FET 165 is a sensing device connected to the bit line BL 130 at node 175 and is connected to the second bit line BR 135 at node 170. The first cell 100 is assumed to be operating and being programmed or being read.

About 5.5 volts is applied to word line WP 120 in programming mode, and one volt is applied in a reading mode. FET 165 is used to sense voltages on a node 150 in the series connection between FET 155 and gate capacitor 145. Each memory cell 100, 105, 110 and 115 is connected to two word lines 120, 125 and 120' and 125' and two bit lines 130 and 135 and 130' and 135' as in a similar manner that discussed for memory cell 100.

FIG. 5 is a voltage table for cell 100 (FIG. 4) in a 0.13 μm process technology cell architecture. The "SW/SB" notation indicates the circuit A is located at the intersection of the selected word (SW) lines and selected bit (SB) lines. The U stands for unselected.

FIG. 6 assumes bit line BR 135 to be a sensing line, however this is not limiting and BL 130 may alternatively be the sensing line. Various operational voltages are possible within the scope of the present invention and depending on the cell. FIG. 6 represents an alternative embodiment of voltage conditions for the cell 100 for the architecture in FIG. 4. Preferably, the transistor types can include P-type or N-type transistors or mixed type transistors and the voltage level may match the requirement of any specific process technology and the voltage can be positive or negative. Preferably, the voltage values in Figs. and 6 are merely illustrative of only one embodiment of the present invention and various other operation voltage conditions are possible and within the scope of the present invention.

FIG. 7 represents a schematic of the circuit 200 which includes a memory cell connected to a column decoder 290 and a sense amplifier 295. Circuit 200 includes a first word line 205 and a second word line 210. The first word line 205 is connected to a node 215. The second word line 210 is connected to a first 220, which is a select 220. Select 220 is a field effect transistor (FET). Select 220 is an N-type.

FET 220 can be constructed from a number of semiconductors, silicon and is made with conventional bulk semiconductor processing techniques, using the single crystal semiconductor wafer as the active region, or channel. FET 220 has a gate, drain, and source terminal that correspond roughly to the base, collector, and emitter. A gate capacitor 225 is provided and connected to the node 215 and the first word line 205. The gate capacitor 225 is also connected to a node 250. Gate capacitor 225 is also FET 225 but can be a different that is the equivalent of a gate capacitor after being programmed. First 220 or select 220 is connected to the node 250 and the gate capacitor 225. The first 220 is also connected to node 255. Node 255 is connected to a bit line B 260. A second FET 270 is a sensing FET 270. Second FET 270 is FET. The sensing FET 270 is of the N-type. The sensing FET 270 is connected to the second bit line 265 by node 280. The sensing FET 270 is also connected to the bit line 260 by the node 275. Node 275 is connected to the node 255. The second sensing FET 270 is connected to the column decoder 290. Column decoder 290 is connected to the sense amplifier 295 at node 300. The column decoder 290 includes FET of the N-type 290b receiving voltage V dd and an optional p-transistor 290a. The FET 290b of the column decoder 290 is connected to node 300. Node 300 is connected to a sense loading 305 and an inverter 310. Various sense amplifier 295 and column decoder 290 configurations are possible and within the scope of the present invention. Because word line voltage WS 210 is zero and if the leakage on node B as defined between node 275 and 280 is small, then the voltage drop between word line WP 205 and 270 can be small. Therefore, the voltage V(B) on reference numeral B at 270 is −0.3 volts. In order to turn on transistor 270, the voltage V(B) needs to be larger than 0.4-0.5 v for a reasonable sensing. The cell architecture of FIG. 7, can be operational under Vdd=0.8 v. Because the memory cell read operation is not sensitive to the programming hardness of the cell, both programming current and programming time can be reduced. This will lead to an easier VPP design work. Also, the voltage on node C shown at node 300 can be very close to a full V dd swing, the sensing circuit can be as rendered as an inverter, as illustrated in FIG. 7. Based on the discussion above, this circuit 200 is quite suitable for low voltage and low power applications.

Figure 8:
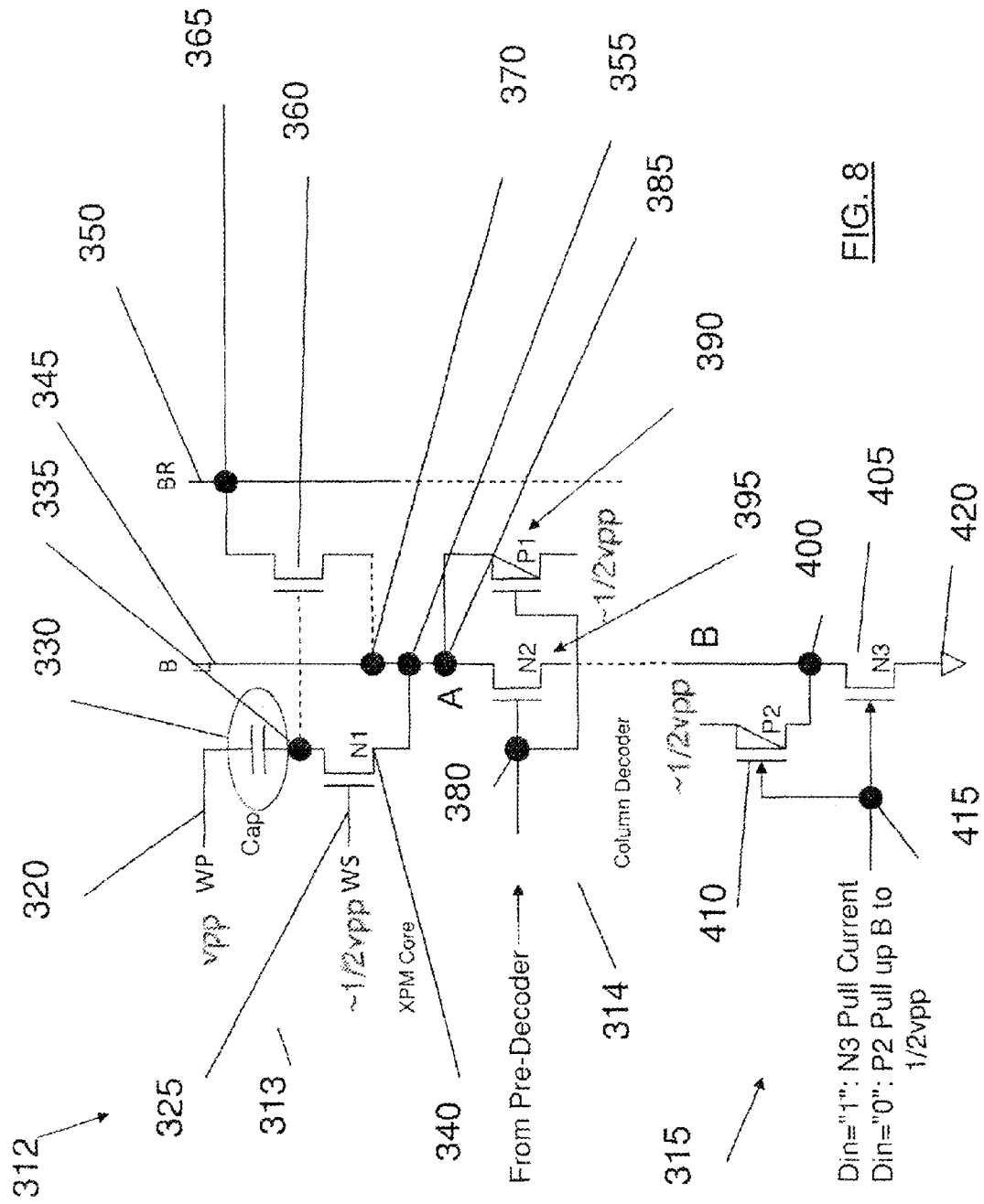
FIG. 8 represents a memory cell connected to a column decoder and a current limiter in a protection mechanism.

FIG. 8 represents a circuit 312 including a memory circuit 313 generally connected to a column decoder circuit 314 and with the decoder circuit 314 connected to a current limiter circuit 315. The circuit 300 includes a first word line WP 320 and a second word line WS 325. The first word line WP 320 has a voltage of Vpp and the second word line WS 325 includes a voltage of about ½ Vpp. Various voltage levels are possible and these values form no limitations to the present invention. The first word line 320 is connected to a gate capacitor 330. Gate capacitor 330 is connected to node 335. The node 335 is connected to a first select 340. Gate capacitor 330 can be FET or another. First select 340 is connected to the second word line WS 325. First select 340 can be FET of the N-type. The circuit 312 also includes a bit line B 345 and a second bit line BR 350. The first select 340 is connected to the bit line B 345 by node 355. The circuit 300 also includes a second sensing device 360. Second sensing device 360 is connected to the second bit line BR 350 at node 365. Second sensing device 360 is also connected to the bit line B 345 at node 370. Second sensing device 360 is FET. The second sensing device 360 is also connected to the node 335 and both bit-selection device 340 and gate capacitor 330. The column decoder circuit 314 includes an input node 380 that receives an input signal from the pre-decoder circuit (not shown) as is known in the art. The column decoder circuit 314 also includes a node 385 which is connected to the bit line B 345. The decoder circuit 314 includes FET 395, which is an N-type connected to the node 385 and the bit line B 345. The decoder circuit 314 also includes a P-type transistor 390 that is connected to node 385. FET 390 receives a voltage of ½ Vpp. FET 395 is further connected to a current limiter circuit 315 at node 400. The current limiter circuit 315 includes an N-type FET 405 and a P-type FET 410. N-type FET 405 is connected to node 400 and ground at 420. P-type FET 410 is connected to node 415. FET 410 receives a voltage of about ½ Vpp.

The signals from the pre-decoder circuit (not shown) will control transistors 390 and 395 exclusively. If the cell is in an unselected column, the signal "0" from the pre-decoder will turn off 395 and turn on the transistor 390. Then, node 385 will be pulled up to −½ Vpp and the gate capacitor 330 will be protected. In single-bit programming with Din="0" or in multiple bits programming and all dins="0" being applied to node 415, the program may be terminated. However, if a cell needs to be programmed in a single programming procedure, then the signal from the pre-decoder, will turn on or off of the transistor FET's 410 and 405 exclusively. When Din="0", transistor 410 will pull node 400 to −½ Vpp, and node 385 will be up to −(½ Vpp-Vtn) and gate 330 can be safely protected. Preferably, circuit 312 can work for both bit lines BL and BR 345 and 350 column decoders as well. The circuit 312 can be applied to column decoding schemes and other device types as is known in the art.

Figure 9:
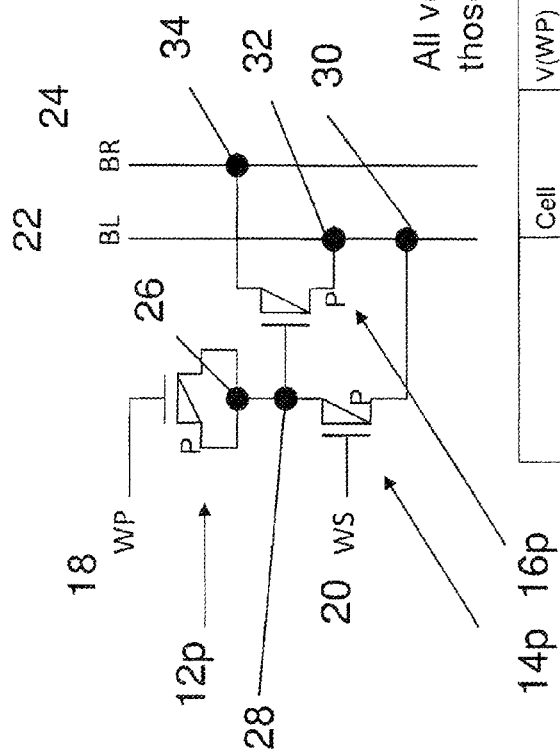
FIG. 9 represents a table of operational voltage conditions for the memory cell of FIG. 3B.

FIG. 9 represents a number of operation voltage values for the configuration of FIG. 3B where FETs 12$p$, 14$p$ and 16$p$ are implemented with P-type devices only with their N wells tied to ground.

In general, NVM memory cell embodiments of the present invention use soft breakdowns in gate oxides to permanently record data bits. Conventional devices depend on hard breakdown modes that require much more power to program each bit and higher voltages to read the results. Here the gate oxide used in an FET is put in series with a bit selection transistor between word line WP and column line BL. A voltage divider results at a gate node that can be measured by a sensing transistor. The sensing transistor, in effect, amplifies the sensitivity of bit reading because a local sense FET is provided at every cell. The much higher breakdown resistances that result in soft breakdown modes are made practical for reading. Because hard breakdown modes are not needed, the high currents needed to sustain hard breakdowns are made unnecessary. Low current, low voltage NVM operation is the result.

While specific embodiments of the present invention are described herein for illustrative purposes, various equivalent modifications are possible, as those skilled in the relevant art will no doubt recognize. While the embodiments of the present invention are described by their best mode contemplated, the present invention can be practiced in many ways. Details of the system described above may vary considerably in its implementation details, while still being encompassed by the present invention disclosed herein. As noted above, particular terminology used when describing certain features or aspects of the present invention should not be taken to imply that the terminology is being redefined herein to be restricted to any specific characteristics, features, or aspects of the present invention with which that terminology is associated. In general, the terms used in the following claims should not be construed to limit the present invention to the specific embodiments disclosed in the specification.

Accordingly, the actual scope of the present invention encompasses not only the disclosed embodiments, but also all equivalent ways of practicing or implementing the present invention under the claims. All of the above patents and applications and other references, including any that may be listed in accompanying filing papers, are incorporated herein by reference. Aspects of the present invention can be modified, if necessary, to employ the systems, functions, and concepts of the various references described above to provide yet further embodiments of the present invention. While this invention has been particularly shown and described with references to a preferred embodiment thereof, it will be understood by those skilled in the art that is made therein without departing from the spirit and scope of the present invention as defined by the following claims.

What is claimed is:

1. A non-volatile memory (NVM) cell, comprising:
    an antifuse element configured in series between a word control line WP, the source-drain of a bit-select transistor, and a column bit line BL, wherein the bit select transistor is connected by its gate to a word select control line WS, and wherein the antifuse element will open in its unprogrammed state and present less than 10M ohms in its programmed state;
    a sensing node at a junction between the antifuse element and the bit select transistor;
    a sensing transistor connected by its gate to the sensing node and by its source and drain between the column bit line BL and a column bit read line BR;

wherein, any current passing through the antifuse element will appear as a voltage drop at the sensing node, and such voltage at the sensing node can act to control the sensing transistor;

wherein, the antifuse and sensing transistor are configured such that less than 5-μA of current is needing for permanent programming; and wherein the following voltage table is representative of the operation in a 0.13 μm process technology, and "SW/SB" notation indicates a circuit A located at an intersection of selected word (SW) lines and selected bit (SB) lines:

|  | Cell | V (WP) | V (WS) | V (BL) | V (BR) |
|---|---|---|---|---|---|
| Programming | A SW/SB | 5.5 V | 2.5 V | 0 V | 0 V |
|  | B SW/UB | 5.5 V | 2.5 V | 2.5 V | 2.5 V |
|  | C UW/SB | 2.5 V | 0 V | 0 V | 0 V |
|  | D UW/UB | 2.5 V | 0 V | 2.5 V | 2.5 V |

-continued

|  | Cell | V (WP) | V (WS) | V (BL) | V (BR) |
|---|---|---|---|---|---|
| Read | A SW/SB | 1.0 V | 0 V | 0 V | V sensing + |
|  | B SW/UB | 1.0 V | 0 V | 0 V | 0 V |
|  | C UW/SB | 0 V | 0 V | 0 V | V sensing + |
|  | D UW/UB | 0 V | 0 V | 0 V | 0 V sensing line. |

2. The non-volatile memory cell of claim 1, further comprising: at least one device configured for current limiting.

3. The non-volatile memory cell of claim 1, wherein: the antifuse element is a field effect transistor and any current passing through it on a read cycle is an indication of its programmed logic level, or data content.

4. The non-volatile memory cell of claim 1, further comprising: the antifuse element is a field effect transistor and is configured for current limiting of read currents.

* * * * *